United States Patent
Hymes

(10) Patent No.: US 6,423,200 B1
(45) Date of Patent: Jul. 23, 2002

(54) COPPER INTERCONNECT SEED LAYER TREATMENT METHODS AND APPARATUSES FOR TREATING THE SAME

(75) Inventor: Diane J. Hymes, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/410,110

(22) Filed: Sep. 30, 1999

(51) Int. Cl.[7] ............................ C25D 5/02; C25D 5/34; C25C 28/00
(52) U.S. Cl. .................... 205/123; 205/183; 205/205
(58) Field of Search .................... 205/123, 183, 205/157, 205, 917

(56) References Cited

U.S. PATENT DOCUMENTS

| | | | |
|---|---|---|---|
| 3,725,224 A | * 4/1973 | Kendall | 204/141.5 |
| 5,256,565 A | * 10/1993 | Bernhardt et al. | 437/228 |
| 5,429,733 A | 7/1995 | Ishida | 204/224 |
| 5,882,498 A | * 3/1999 | Dubin et al. | 205/261 |
| 6,001,730 A | * 12/1999 | Farkas et al. | 438/627 |
| 6,083,419 A | * 7/2000 | Grumbine et al. | 252/79.1 |
| 6,197,181 B1 | * 3/2001 | Chen | |

FOREIGN PATENT DOCUMENTS

| | | | |
|---|---|---|---|
| EP | 0 880 168 | * | 11/1998 |
| EP | 0 903 774 | | 3/1999 |
| JP | 11335896 | * | 7/1999 |
| WO | WO 99/09593 | | 2/1999 |
| WO | WO 99/47731 | | 9/1999 |

* cited by examiner

Primary Examiner—Donald R. Valentine
Assistant Examiner—Erica Smith-Hicks
(74) Attorney, Agent, or Firm—Martine & Penilla, LLP

(57) ABSTRACT

A method for making semiconductor interconnect features in a dielectric layer is provided. The method includes depositing a copper seed layer over a barrier layer that is formed over the dielectric layer and into etched features of the dielectric layer. The copper seed layer is then treated to remove an oxidized layer from over the copper seed layer. The method then moves to electroplating a copper fill layer over the treated copper seed layer. The copper fill layer is configured to fill the etched features of the dielectric layer.

18 Claims, 6 Drawing Sheets

COPPER INTERCONNECT SEED LAYER TREATMENT METHODS AND APPARATUSES FOR TREATING THE SAME

BACKGROUND OF THE INVENTION

1. Field of the Invention

The present invention relates generally to semiconductor device fabrication and, more particularly, to methods and apparatus for fabricating more reliable interconnect metallization lines.

2. Description of the Related Art

The semiconductor device fabrication process beings with the fabrication of semiconductor wafers. Each wafer is then placed through a multitude of processing steps in order to produce an array of semiconductor dies. As is well known, transistors are first fabricated over the semiconductor wafer and then multiple levels of metallization lines and conductive vias are formed to interconnect the transistors. When copper interconnect metallization lines are used, processes referred to as damascene and dual-damascene are used to form trenches and via holes in dielectric layers. As will be described below, there are several problems with the normal copper fill process.

Reference is now made to FIG. 1A, which illustrates a cross-section view of a patterned dielectric layer 100. As shown, the dielectric layer 100 has a via hole 102, and a trench 104. A barrier layer 105 is typically deposited over the dielectric layer 100 and into the via hole 102 and the trench 104. Typically, the barrier layer is a tantalum material, a tantalum nitride material, or a combination of both. A copper seed layer 106 is then blanket deposited over the barrier layer 105 so as to line the inner walls and surfaces within the via hole 102 and trench 104. The copper seed layer is needed to promote good adhesion and establish a good electrical contact between copper interconnect lines. The copper seed layer 106 is typically deposited using either a chemical vapor deposition (CVD) technique or a physical vapor deposition (PVD) technique. Once the copper seed layer 106 is deposited, the wafer is moved out of the deposition chamber and introduced to atmospheric conditions and exposed to oxygen before beginning a bulk copper fill process. During this time, which can vary widely depending on process parameters and throughput factors, the copper seed layer 106 will naturally tend to oxidize due to the exposure to oxygen.

Although the oxidation of the copper seed layer does not affect the copper on the top surface of the dielectric layer 100, the amount of copper deposited in the trench 104 and via hole 102 is substantially thinner and is therefore affected most by copper oxidation. For instance, if a layer having a thickness X is deposited for the seed layer 106, only about 10% of X will actually be deposited on the walls 110 of the via hole 102. It is believed that approximately 10 to 30 percent of the copper seed layer 106 is oxidized before the bulk copper fill operation is performed. As shown in FIG. 1B, a top region 106a of the copper seed layer 106 is oxidized, leaving only the lower portion 106b as non-oxidized copper. Once the copper seed layer 106 is formed, a bulk copper fill 108 is performed to fill in the remainder of the via hole 102 and trench 104.

A problem with having the copper seed layer oxidize is that the oxidized top region 106a may introduce performance defects in the interconnect metallization lines. For instance, the quality of the electroplated bulk copper fill 108 may be compromised, and thus form a less than perfect material bond with the copper seed layer 106. Not only may the bond suffer due to the excessive presence of copper oxide 106a, but there will be less true copper material on the walls 110. Because the filled via is the interface to lower conductive metallization lines or transistor devices, such interfaces will most likely be compromised due to the reduction of copper seed material that is needed to promote good bonding to the electroplated copper fill 108.

One solution to remove the oxidation is to move the wafer into an etch chamber to etch away the copper oxide build-up. Although this technique can remove the copper oxide, etching also removes some of the copper seed layer 106a. This is a problem since the thickness of the copper seed layer 106 is already very thin on the walls 110. Any further removal of copper from the seed layer 106 can present a situation where an insufficient of copper seed layer 106 remains to enable proper electroplating of copper. If too much copper seed layer 106 is removed, copper interconnect lines and copper filled vias may present defects that reduce reliability and performance of an integrated circuit device. For more information on electroplating, reference can be made to U.S. Pat. No. 5,882,498, which illustrates conventional techniques for electroplating copper materials. This U.S. Patent is hereby incorporated by reference.

In view of the foregoing, there is a need for a method for forming copper interconnect features that do not suffer from the aforementioned problems. In particular, there is a need for a method of copper filling trenches and vias to define copper interconnect features, without compromising the integrity of a copper seed layer used to tart the copper fill process.

SUMMARY OF THE INVENTION

Broadly speaking, the present invention fills these needs by providing a method and apparatus for treating copper seed layers before copper electroplating operations are performed to fill etched trenches and/or vias that define copper interconnect structures. It should be appreciated that the present invention can be implemented in numerous ways, including as a process, an apparatus, a system, a device or a method. Several inventive embodiments of the present invention are described below.

In one embodiment, a method for making semiconductor interconnect features in a dielectric layer is disclosed. The method includes depositing a copper seed layer over the dielectric layer and into etched features of the dielectric layer having a barrier layer thereon. The copper seed layer is then treated to remove an oxidized layer from over the copper seed layer. The method then moves to electroplating a copper fill layer over the treated copper seed layer. The copper fill layer is configured to fill the etched features of the dielectric layer. In one example, the treating of the copper seed layer includes applying a solution to the copper seed layer including hydrofluoric acid (HF), citric acid, and ammonia mixed in de-ionized water.

In another embodiment, a method for making copper interconnect features in a dielectric layer is disclosed. The method includes depositing a copper seed layer over a barrier layer that is formed over the dielectric layer and into high aspect ratio etched features of the dielectric layer. After the copper seed layer is deposited, the copper seed layer is treated to remove an oxidized layer from over the copper seed layer without removing the copper seed layer. Then, a bulk layer of copper is filled in over the treated copper seed layer. The bulk layer of copper is configured to fill the high aspect ratio etched features of the dielectric layer.

In yet another embodiment, an apparatus for fabricating copper interconnect lines is disclosed. The apparatus includes: (a) a deposition station for depositing a copper seed layer over a barrier layer, the barrier layer lining a dielectric layer and etched features of the dielectric layer of a substrate; (b) a treating module for receiving the substrate and removing a copper oxide layer from over the copper seed layer; and (c) an electroplating module that is connected in-situ with the treating module. The electroplating module is configured to bulk fill copper over the treated copper seed layer and fill the etched features of the dielectric layer.

Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings, in which like reference numerals designate like structural elements.

DETAILED DESCRIPTION OF THE PREFERRED EMBODIMENTS

An invention for forming metallization interconnect features is disclosed. In a specific example, the metallization interconnect features are copper features, and a method is disclosed for treating copper seed layers that are formed before the electroplating of copper that fills etched barrier lined trenches and/or vias that define copper interconnect structures. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

In one embodiment of the present invention, a method is disclosed for forming a copper seed layer over a barrier layer that is formed over a dielectric layer having etched features, such as trenches and/or vias. The copper seed layer is preferably deposited in a deposition chamber. Once deposited, the wafer having the etched features is then moved out of the chamber and into atmospheric conditions that expose the copper seed layer to oxygen. Depending on the amount of time, the exposure to oxygen causes a layer of copper oxide to grow in the copper seed layer. Before copper electroplating is performed, the method moves the wafer into a treatment module wherein the copper oxide is removed without removing the remaining copper seed layer. Once the copper oxide is removed from the copper seed layer, the wafer is immediately moved, e.g., within a few seconds, into an electroplating module. In the electroplating module, a bulk copper fill layer is plated over the copper seed layer to fill the trenches and/or vias. In the following description, several embodiments describing the treating process and cluster modules that can be used to perform the combined treating and electroplating are provided.

Figure 1A:
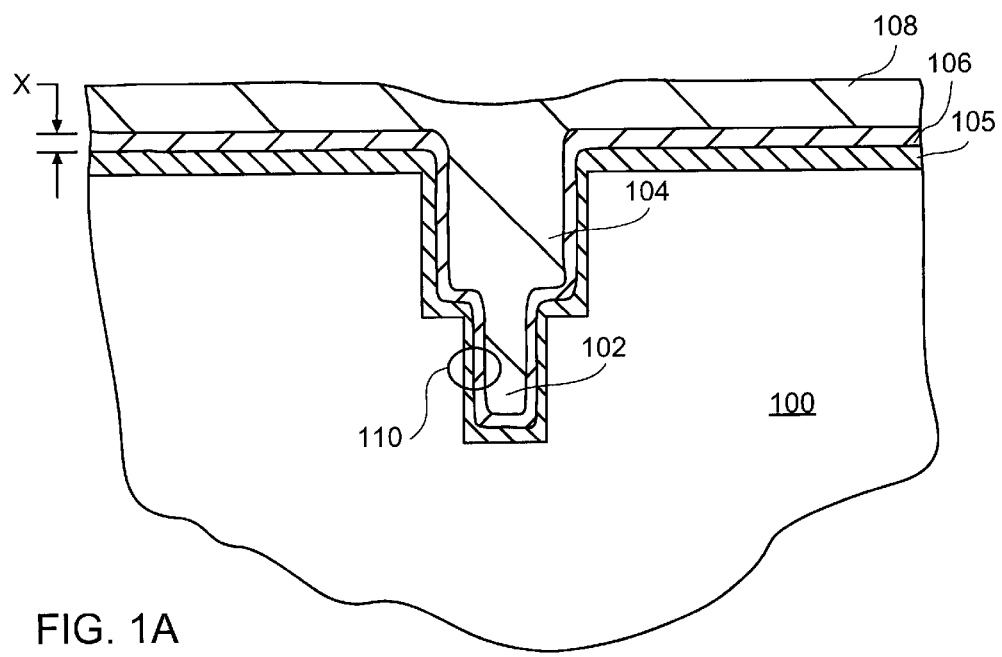
FIGS. 1A and 1B illustrate cross-section views of a patterned dielectric layer having a barrier layer, a formed copper seed layer over the barrier layer, and a formed copper fill layer.
Figure 1B:
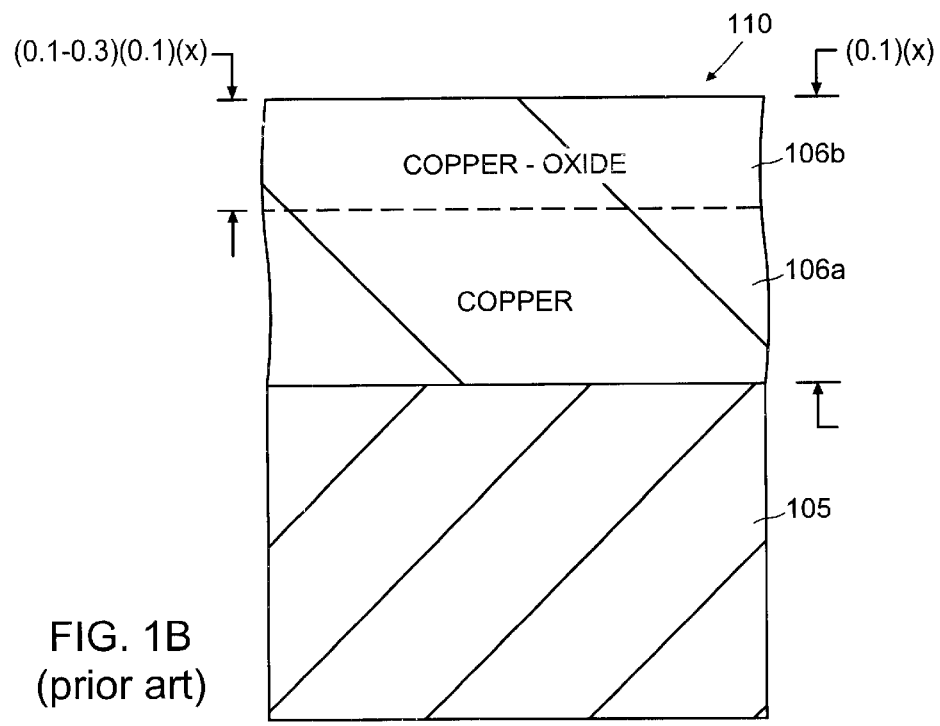
Figure 2A:
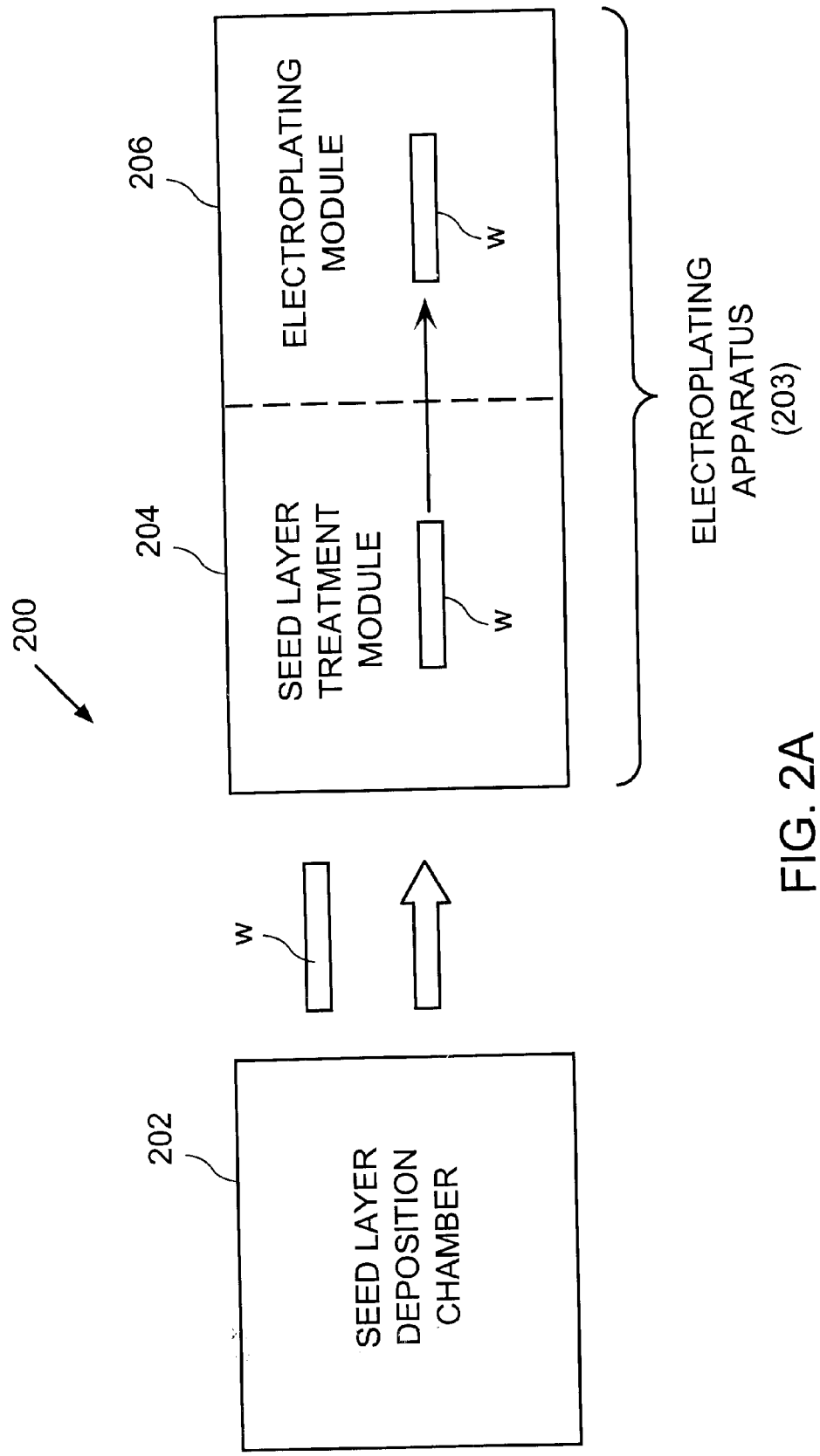
FIG. 2A illustrates a process system diagram that includes a seed layer deposition chamber and an electroplating apparatus, in accordance with one embodiment of the present invention.

FIG. 2A illustrates a process system diagram 200 that includes a seed layer deposition chamber 202 and an electroplating apparatus 203, in accordance with one embodiment of the present invention. The electroplating apparatus 203 includes a seed layer treatment module 204 and an electroplating module 206. The electroplating module 206 can be any conventional electroplating module that is configured to electroplate a metallization layer over a surface. In one example, the surface can be a copper seed layer deposited on a wafer W in the seed layer deposition chamber 202. The electroplating module 206 is configured to place the wafer W through an electroplating process that utilizes an electrolyte solution.

Typically, an anode is positioned in the electrolyte solution and a cathode is coupled to the silicon wafer for providing an electrical current. The electric current, electrolyte solution, and the wafer then react to form a metal layer on the wafer surface over the seed layer deposited in chamber 202. In this embodiment, the seed layer deposition chamber 202 is configured to deposit a thin copper layer over a barrier layer that is defined over the surface of the wafer W and into etched features that define trenches and/or vias. In one embodiment, the barrier layer can be any suitable barrier layer. In a specific example, the barrier layer can be a tantalum material, a tantalum nitride material, or a combination thereof.

In copper interconnect technology, dielectric layers of the wafer W are etched to define the locations of the metallization lines that form the network of interconnect metallization for a given layer. The seed layer deposition chamber 202 will be configured to deposit the thin layer of copper over the barrier layer. For example, a typical seed layer deposition will deposit approximately 1500 Å of copper seed layer over the top surface of the wafer W. However, as discussed above, the amount of copper deposited on the walls of small features having high aspect ratios will be substantially less, and typically about 10% of the total 1500 Å.

Once the wafer W has been deposited with the appropriate thickness of a copper seed layer in seed layer deposition chamber 202, the wafer is removed from the chamber 202 and exposed to oxygen before being introduced into the electroplating apparatus 203. Before commencing the electroplating process in the electroplating module 206, the wafer is introduced into a seed layer treatment module 204. The seed layer treatment module 204 is configured to substantially remove any growth of copper oxide that occurred in the copper seed layer that was deposited in chamber 202.

In one preferred embodiment, the seed layer treatment module 204 is configured to provide a chemical cleaning solution that is made up of de-ionized water, an organic compound, and a fluoride compound, all of which are combined in an acidic pH environment. The use of the acidic pH environment is configured to dissolve the copper oxide that was formed on the copper seed layer when the wafer W was transferred between the chamber 202 and into the electroplating apparatus 203. In this embodiment, it is preferred that the acidic pH environment be maintained within a range of approximately 1 and 6. In a more preferred embodiment, the acidic pH environment has a pH level in the range of approximately 2 to 4.

The organic compound used may be an organic acid, the ammonium salt of an organic acid, or an anionic surfactant. Some examples of potential organic acids may include, citric acid, malic acid, malonic acid, and succinic acid, or any combination of such organic acids. The organic compound should be dissolved in de-ionized water in a concentration range of approximately 100 ppm to 2% by weight. In another embodiment, the organic compound is dissolved in de-ionized water such that the concentration range is approximately 200 ppm to 0.2% by weight.

The fluoride compound can be hydrofluoric acid (HF) or ammonium fluoride ($NH_4F$). Preferably, the fluoride compound is dissolved in de-ionized water in a concentration range of approximately 0.1% to 5% by weight. In a more specific example, the copper oxide removing solution can be 0.5% HF, 0.1% citric acid, and 0.4% $NH_4OH$ by weight mixed in de-ionized water. The pH level of the solution in this example is approximately 3.

It should be noted that the seed layer treatment module 204 is therefore a module that is capable of rinsing in a bath or scrubbing using scrub brush technology, the wafer W with a cleaning solution to remove the copper oxide from over the seed layer deposited in chamber 202 before the electroplating module 206 performs electroplating over the seed layer. In this manner, the electroplating module 206 will be capable of depositing a more uniform and defect-free layer of copper over the copper seed layer and thus avoiding the problems described with reference to the prior art.

It should also be noted that the electroplating apparatus 203 is preferably a combined module that allows the treating and plating process to be performed in-situ and therefore, allow the plating process to occur just after the treatment of the seed layer in module 204. Thus, the electroplating apparatus 203 is preferably a clustered tool that will efficiently perform the treatment of the seed layer just before the electroplating process occurs in the electroplating module 206. For more information on cleaning techniques for removing copper oxide, reference may be made to U.S. patent application Ser. No. 08/955,393, entitled METHODS AND APPARATUS FOR CLEANING SEMICONDUCTOR SUBSTRATES AFTER POLISHING OF COPPER FILM, and filed on Oct. 21, 1997. This application is hereby incorporated by reference.

Figure 2B:
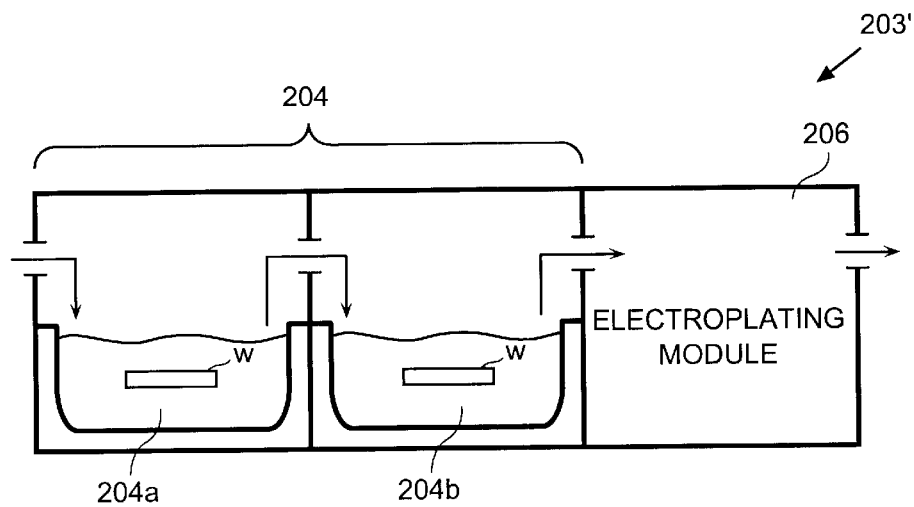
FIG. 2B illustrates an electroplating apparatus, in accordance with an alternative embodiment of the present invention.

FIG. 2B illustrates an electroplating apparatus 203', in accordance with an alternative embodiment of the present invention. The seed layer treatment module 204, in this embodiment, includes two separate baths for treating the seed layer before introducing the wafer W into the electroplating module 206. As mentioned above, the baths can be replaced with brush boxes. The wafer is first inserted into a first rinsing bath 204a wherein oxide removal is performed on the seed layer that was deposited in the seed layer deposition chamber 202. As mentioned above, the solution used to remove the oxide from over the copper seed layer is preferably an acid containing solution which is configured to dissolve the copper oxides from over the seed layer.

Once the wafer W has been rinsed to remove the copper oxides in bath 204a, the wafer is move into a de-ionized water bath 204b where in the de-ionized water rinses away the oxide removing chemicals before being introduced into the electroplating module 206. In this embodiment, it may be preferred that the solution used to remove the copper oxide in bath 204a be removed before performing the electroplating in the electroplating module 206. In such a case, the de-ionized water rinse bath 204b will be configured to perform such a task to substantially remove the copper oxide removing solutions.

Figure 2C:
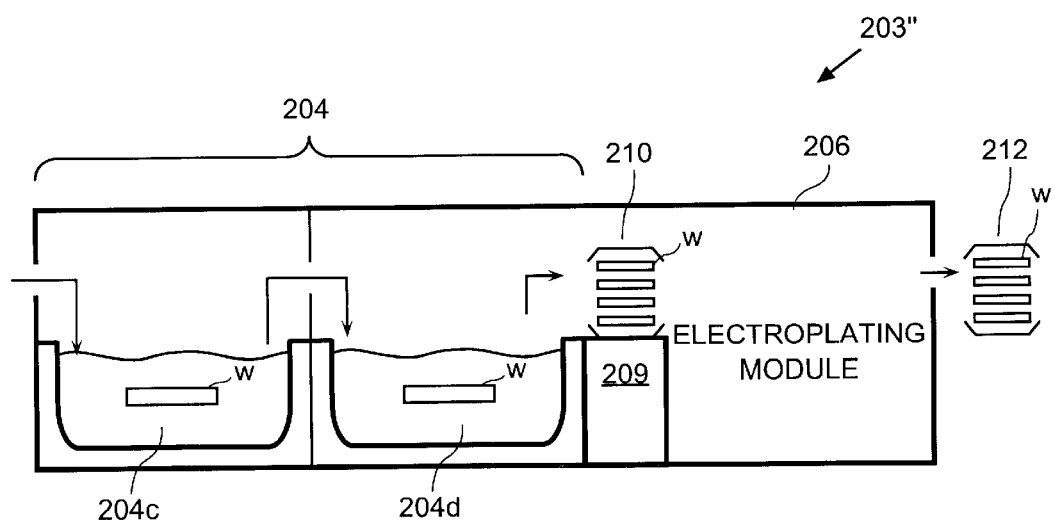
FIG. 2C illustrates another electroplating apparatus in which the seed layer treatment module includes two separate sub-modules for treating the copper seed layer before electroplating is performed, in accordance with yet another alternative embodiment of the present invention.

FIG. 2C illustrates an electroplating apparatus 203" in which the seed layer treatment module 204 includes two separate sub-modules for treating the copper seed layer before electroplating is performed in the electroplating module 206. In this embodiment, the apparatus 203" may include a cassette 210 which is placed in a staging region 209. The staging region 209 will hold wafers for some time before electroplating in the electroplating module 206 is performed. In this embodiment, because the wafers W may spend some time in the cassette 210 before being electroplated, the seed layer treatment module 204 will first perform oxide removal in bath 204c and then move to a bath 204d wherein the copper seed layer is passivated to prevent or inhibit the growth of copper oxide during the time the wafers sit in the cassette 210 (i.e., or are exposed to oxygen). In this manner, the wafers sitting in the cassette 210 will not become unduly oxidized while they wait to be electroplated with copper in the electroplating module 206.

After electroplating, the wafer W can be output to a cassette 212 outside of the electroplating apparatus 203". Further processing, such as chemical mechanical polishing (CMP) can then be performed to define metallization features. In this embodiment, it is preferred that the oxide removing bath 204c be an acid containing solution diluted in de-ionized water. For example, citric acid having a 0.2% concentration in de-ionized (DI) water and a pH level of 2, hydrochloric acid (HCL) having a 0.1% concentration in DI water, malic acid having a 0.2% concentration in DI water, or malonic acid having a 0.2% concentration in DI water may all be used where concentration levels are by weight. Of course, each of these concentration levels may be varied depending on, for example, the thickness of the copper oxide to be removed or the desired processing time. Thus, ranges at least as wide as 0.005% to 0.5% for citric, malic and malonic acids, and 0.01% to 0.2% for HCL may all be used. Furthermore, any of the above-described solutions may be further buffered by (i.e., also add), 100 ppm to 0.2% of ammonium hydroxide. Other solutions known in the art for removing oxides may also be applied.

Once the oxide removal is performed in the bath 204c, the wafer is moved into a bath 204d. In the bath 204d, the passivation of the copper seed layer is then performed to protect against the growth of copper oxide in the copper seed layer. In one embodiment, the solution is generally comprised of members of the azole family. Azoles, such as Benzotriazole (BTA), are known to provide protection against the growth of oxides on copper. BTA is currently the most widely used passivating agent for copper and is the major component of many commercially available solutions used for copper oxide prevention. An example passivating agent may include Stopox™ from Applied Chemical Technologies, Inc.

Other azoles that have been used for copper oxide prevention include Ineazole, Bebnzimidazole, Indole, and Methylbenzotriazole. For more information on oxide removal and passivating agents, reference may be made to U.S. patent application Ser. No. 09/282,596, entitled METHOD AND APPARATUS FOR ENABLING CONVENTIONAL WIRE BONDING TO COPPER-BASED BOND PAD FEATURES, and filed on Mar. 31, 1999. This application is hereby incorporated by reference.

It should be noted that the electroplating apparatus 203" is well suited to perform the copper seed layer treatment in such a way that copper oxides are prevented from growing while wafers W sit in a cassette 210 before being electroplated with copper in the electroplating module 206. The passivating just before the electroplating is performed will therefore allow greater process flexibility since the wafers need not be electroplated immediately after being cleaned of copper oxides. In other embodiments described with reference to FIGS. 2A and 2B, it may be more desirable to perform the seed layer treatment immediately before performing the electroplating.

Figure 3A:
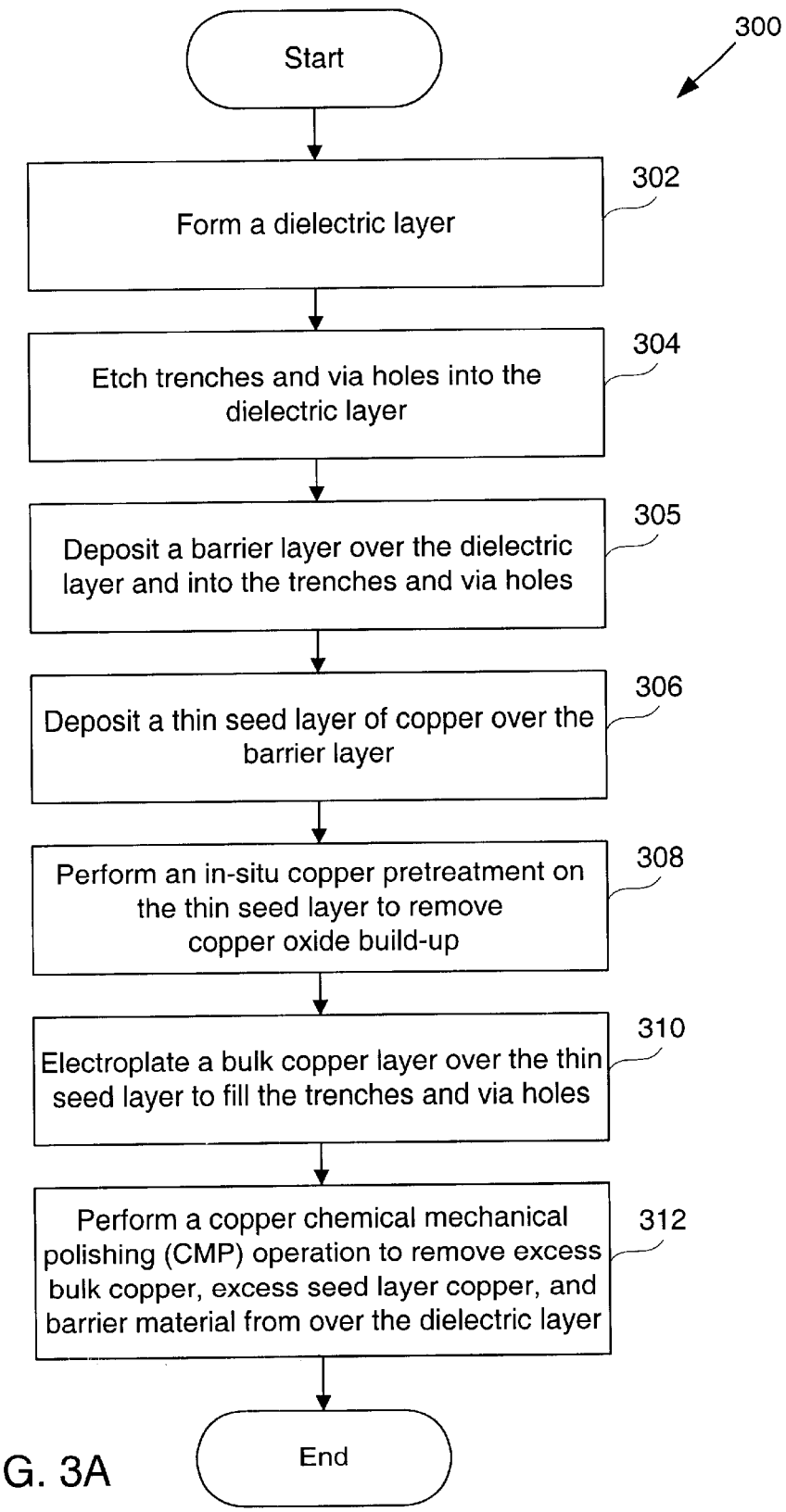
FIG. 3A illustrates a flowchart diagram of the process operations performed to pre-treat a copper seed layer used in copper interconnect lines before a bulk copper fill operation is performed in an electroplating module, in accordance with one embodiment of the present invention.

FIG. 3A illustrates a flowchart diagram 300 of the process operations performed to pre-treat a copper seed layer used in copper interconnect lines before a bulk copper fill operation is performed in an electroplating module, in accordance with one embodiment of the present invention. The method begins at an operation 302 where a dielectric layer is formed over a particular layer of a substrate or wafer. Once the dielectric layer is formed, the method proceeds to operation 304 where trenches and/or via holes are etched into the dielectric layer.

The trenches and/or vias are typically etched using a damascene or dual damascene etching technique in order to form the etched features that will become the interconnect metallization lines and conductive vias. Once the etching of the trenches and/or via holes is complete in operation 304, the method proceeds to an operation 305 wherein a barrier layer is deposited over the dielectric layer and into the trenches and via holes. In operation 306, a thin seed layer of copper is deposited over the barrier layer. Typically, seed layer deposition operation is performed in either a chemical vapor deposition (CVD) chamber or a physical vapor deposition (PVD) chamber.

Commonly, the deposited seed layer ranges in thickness between about 100 Å and about 3000 Å, and more preferably, between about 500 Å and about 2000 Å, and most preferably about 1500 Å. As mentioned above, the thickness of the seed layer on the walls of higher aspect ratio features is typically much less, and is believed to typically be about between about 30% and 5% of the deposited thickness. Of course, the actual thickness of the seed layer depends upon the process technology being implemented for a particular integrated circuit design. Once the thin seed layer of copper is deposited in operation 306, the method moves to operation 308 where an in-situ copper pretreatment is performed on the thin seed layer to remove copper oxide build-up. As mentioned above with reference to FIGS. 2A–2C, once the thin seed layer is deposited in operation 306, the wafer is moved out of the deposition chamber and into atmospheric conditions where it is exposed to oxygen. The oxygen will thus immediately begin to oxidize the thin seed layer of copper.

Thus, the in-situ copper pretreatment is configured to remove the copper oxide from the thin seed layer of copper. As explained above, techniques for removing the copper oxide include using a chemical solution bath for rinsing the wafer and removing the copper oxides before the wafer is introduced into the electroplating module. Although specific examples of baths with solutions for removing copper oxides are shown, it is conceivable that the bath can be replaced with a scrub brush apparatus that can scrub the surface of the wafer in order to remove the copper oxides from the copper seed layer before the electroplating is performed in the electroplating module. In either case, the pretreatment is preferably performed in an electroplating apparatus that is in the form of a cluster architecture, and thus enables immediate electroplating just after the pretreatment is performed in-situ in the treatment module 204.

Once the pretreatment is performed on the thin seed layer to remove the copper oxide build-up in operation 308, the method proceeds to an operation 310 where a bulk copper layer is electroplated over the thin seed layer to fill the trenches and/or vias. The removal of the copper oxide is believed to reduce defects as well as improve overall consistency of the electroplated copper film. Additionally, it is preferred that the pretreatment which preferentially removes the copper oxides will leave the copper seed layer intact (i.e., minimal attack on the copper seed layer), and thus will enable for a better bond and interface between the copper seed layer and the bulk copper layer that is electroplated in operation 310. After the electroplating is complete in operation 310, the method will proceed to an operation 312 where a copper chemical mechanical polishing (CMP) operation is performed to remove excess bulk copper, excess seed layer copper, and barrier layer from over the dielectric layer.

Figure 3B:
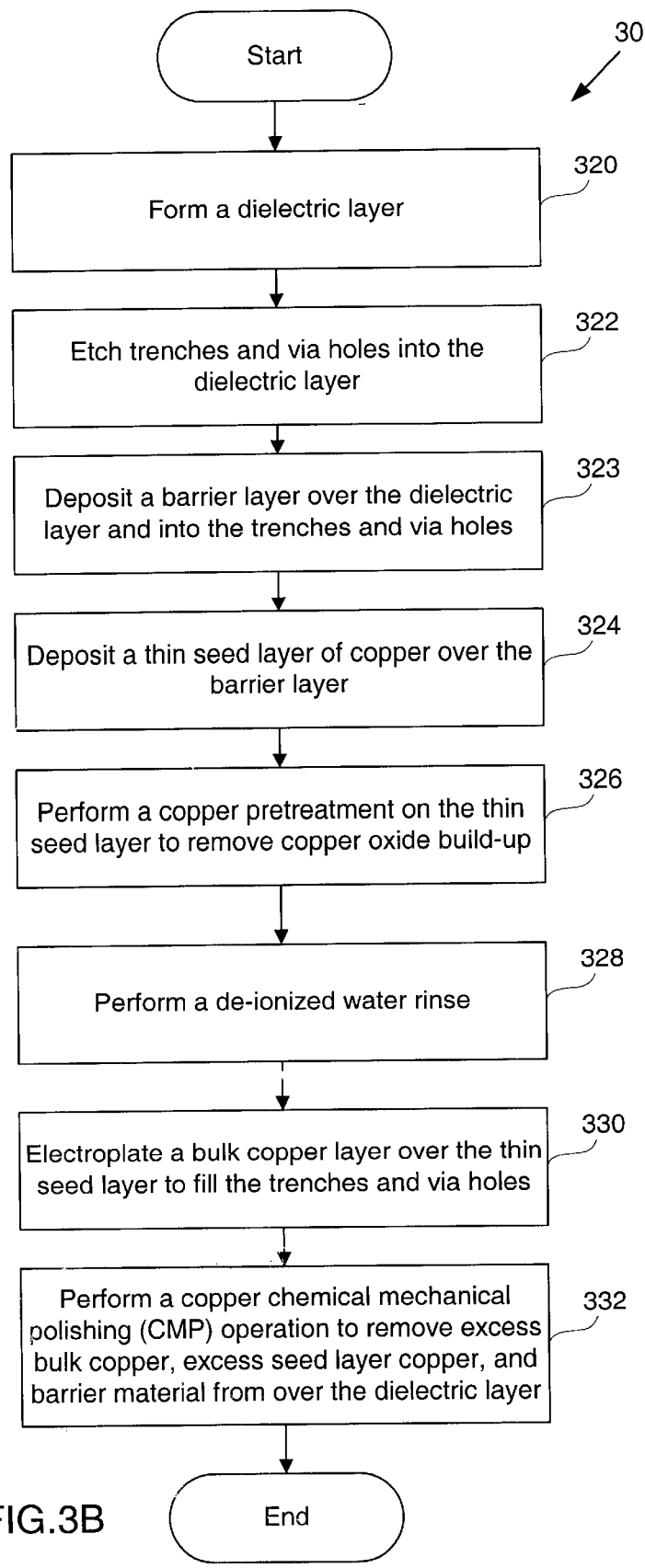
FIG. 3B shows a flowchart diagram in accordance with another embodiment of the present invention.

FIG. 3B shows a flowchart diagram 300' in accordance with another embodiment of the present invention. The method begins at an operation 320 where a dielectric layer is formed over a particular layer of a substrate or wafer. Trenches and/or vias are then etched into the dielectric layer to form the locations of the copper interconnect lines and conductive vias. A barrier layer is deposited over the dielectric layer in operation 323, and then a thin seed layer of copper is then deposited over the barrier layer and into the trenches and via holes in operation 324. At this point, a copper pretreatment is performed on the thin seed layer to remove the copper oxide build-up in operation 326.

As described above, the pretreatment is configured to substantially remove all of the copper oxide from the copper seed layer while leaving the remaining copper seed layer intact. Once the copper pretreatment is performed in operation 326, a de-ionized water rinse is performed in operation 328 before a bulk copper layer is electroplated over the thin seed layer to fill the trenches and/or via holes in operation 330. The de-ionized water rinse is preferably performed in cases where it is desirable to remove the chemical solution used to remove the copper oxides before the electroplating is performed. Once the electroplating is complete, the method will proceed to an operation 332 where a copper chemical mechanical polishing operation is performed to remove excess bulk copper, excess seed layer copper, and barrier layer to form the dielectric layer. At this point, a network of copper interconnect lines and vias are formed in the dielectric layer.

Figure 3C:
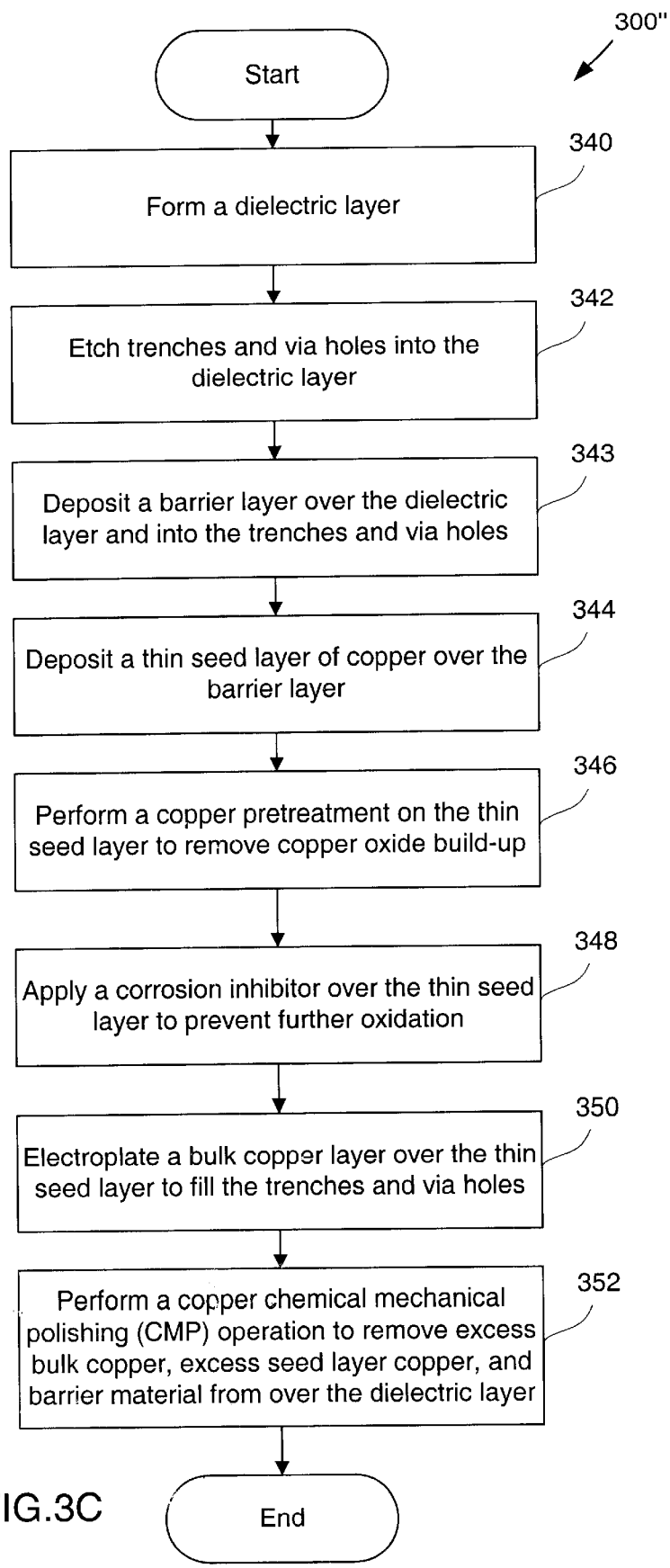
FIG. 3C illustrates a flowchart in which another embodiment of the present invention is described.

FIG. 3C illustrates a flowchart 300" in which another embodiment of the present invention is described. The method begins at an operation 340 where a dielectric layer is formed as was done in operations 302 and 320. Trenches and/or via holes are then etched into the dielectric layer in operation 342, a barrier layer is formed in opeation 343, and a thin seed layer of copper is deposited over the barrier layer and into the trenches and via holes in operation 344. In operation 346, a copper pretreatment is performed on the thin seed layer to remove the copper oxide build-up. As discussed above, the copper oxide is preferably removed while leaving intact the copper seed layer.

Next, the method moves to an operation 348 where a corrosion inhibitor is applied over the thin seed layer to prevent further oxidation. In this embodiment, the corrosion inhibitor is preferably a passivating agent which will retard or further prevent the copper seed layer from oxidizing before the electroplating is performed in operation 350.

Once the electroplating is performed in operation 350, a chemical mechanical polishing operation is performed to remove the excess bulk copper, excess seed layer copper, and barrier material from the dielectric layer and thus forming the copper interconnect and conductive via network.

While this invention has been described in terms of several preferred embodiments, it will be appreciated that those skilled in the art upon reading the preceding specifications and studying the drawings will realize various alterations, additions, permutations and equivalents thereof. For example, although specific reference is made to baths, brush boxes containing brushes for scrubbing wafers can also work to perform the oxide removal and/or passivating operations of the present invention. Additionally, the described embodiments can be applied to any size wafer, such as, 200 mm, 300 mm, and larger, as well as other sizes and shapes. It is therefore intended that the present invention includes all such alterations, additions, permutations, and equivalents that fall within the true spirit and scope of the invention.

What is claimed is:

1. A method for making semiconductor interconnect features in a dielectric layer, comprising:

depositing a copper seed layer over the dielectric layer and into etched features of the dielectric layer having a barrier layer thereon;

treating the copper seed layer in an acidic environment to remove an oxidized layer from over the copper seed layer; and electroplating a copper fill layer over the treated copper seed layer after the treating, the copper fill layer being configured to fill the etched features of the dielectric layer.

2. A method for making semiconductor interconnect features in a dielectric layer as recited in claim 1, wherein the depositing of the copper seed layer is performed in one of a chemical vapor deposition chamber and a physical deposition chamber, and the deposition forms a thicker layer of copper over a bottom surface of the barrier layer and a thinner layer of copper on walls of the etched features.

3. A method for making semiconductor interconnect features in a dielectric layer as recited in claim 2, wherein once the depositing of the copper seed layer is complete, the copper seed layer is exposed to atmospheric conditions that cause oxidation of both the thicker layer and the thinner layer.

4. A method for making semiconductor interconnect features in a dielectric layer as recited in claim 1, wherein the treating the copper seed layer includes:

applying a solution including hydrofluoric acid (HF), citric acid, and ammonia mixed in de-ionized water to the surface of the copper seed layer just before the electroplating.

5. A method for making semiconductor interconnect features in a dielectric layer as recited in claim 4, wherein the treating is done in-situ with the electroplating.

6. A method for making semiconductor interconnect features in a dielectric layer as recited in claim 1, wherein the treating is done in-situ with the electroplating.

7. A method for making semiconductor interconnect features in a dielectric layer as recited in claim 1, wherein the treating includes:

applying an acid diluted in de-ionized water to cause the removal of the oxidized layer from the copper seed layer; and applying an azoles solution over the copper seed layer after the removal of the oxidized layer, the azoles solution causing an oxide growth retarding passivation layer over the copper seed layer.

8. A method for making semiconductor interconnect features in a dielectric layer as recited in claim 7, wherein the azoles solution is Benzotriazole (BTA).

9. A method for making semiconductor interconnect features in a dielectric layer, comprising:

depositing a copper seed layer over the dielectric layer and into etched features of the dielectric layer having a barrier layer thereon;

treating the copper seed layer to remove an oxidized layer from over the copper seed layer by applying a solution including de-ionized water, an organic compound, and a fluoride compound combined in an acidic pH environment to the surface of the copper seed layer; and electroplating a copper fill layer over the treated copper seed layer after the treating, the copper fill layer being configured to fill the etched features of the dielectric layer.

10. A method for making semiconductor interconnect features in a dielectric layer as recited in claim 4, wherein the organic compound is an organic acid.

11. A method for making semiconductor interconnect features in a dielectric layer as recited in claim 10, wherein the organic acid is one of a citric acid, a malic acid, malonic acid, succinic acid.

12. A method for making semiconductor interconnect features in a dielectric layer as recited in claim 4, wherein the fluoride compound is one of hydrofluoric acid, ammonium fluoride ($NH_4F$).

13. A method for making copper interconnect features in a dielectric layer, comprising:

depositing a copper seed layer over a barrer layer that is formed over the dielectric layer and into high aspect ratio etched features of the dielectric layer;

treating the copper seed layer in an acidic environment to remove an oxidized layer from over the copper seed layer, the treating being configured to prevent the removal of non-oxide copper from the copper seed layer; and filling a bulk layer of copper over the copper seed layer after the treating, the bulk layer of copper being configured to fill the high aspect ratio etched features of the dielectric layer.

14. A method for making copper interconnect features in a dielectric layer as recited in claim 13, wherein the filling a bulk layer of copper is performed in an electroplating module.

15. A method for making copper interconnect features in a dielectric layer as recited in claim 13, wherein the treating includes:

applying an acid diluted in de-ionized water to cause the removal of the oxidized layer from the copper seed layer.

16. A method for making copper interconnect features in a dielectric layer as recited in claim 15, wherein the acid diluted in de-ionized water is buffered with ammonium hydroxide ($NH_4OH$).

17. A method for making copper interconnect features in a dielectric layer as recited in claim 13, wherein the treating includes:

applying a solution including HF, citric acid, and ammonium hydroxide ($NH_4OH$) just before performing the filling of the bulk layer of copper over the treated copper seed layer.

18. A method for making copper interconnect features in a dielectric layer as recited in claim 15, wherein the treating and the filling are performed in-situ.

* * * * *